United States Patent [19]

Sakakibara et al.

[11] Patent Number: 5,449,946

[45] Date of Patent: Sep. 12, 1995

[54] SEMICONDUCTOR DEVICE PROVIDED WITH ISOLATION REGION

[75] Inventors: Toshio Sakakibara, Nishio; Makio Iida, Ichinomiya; Takayuki Sugisaka, Okazaki; Shoji Miura, Nukata, all of Japan

[73] Assignee: Nippondenso Co., Ltd., Kariya, Japan

[21] Appl. No.: 208,119

[22] Filed: Mar. 9, 1994

[30] Foreign Application Priority Data

Mar. 10, 1993 [JP] Japan .................. 5-049656

[51] Int. Cl.6 .................. H01L 29/06; H01L 27/02
[52] U.S. Cl. .................. 257/487; 257/493; 257/505
[58] Field of Search .................. 257/487, 493, 520, 505

[56] References Cited

U.S. PATENT DOCUMENTS

| | | |
|---|---|---|
| 3,990,102 | 11/1976 | Okuhara et al. |
| 4,231,056 | 10/1980 | Taylor .................. 257/520 |
| 4,470,062 | 9/1984 | Muramatsu .................. 257/520 |
| 4,661,202 | 4/1987 | Ochii . |
| 5,241,210 | 8/1993 | Nakagawa et al. .................. 257/520 |

FOREIGN PATENT DOCUMENTS

| | | | |
|---|---|---|---|
| 60-60753 | 4/1985 | Japan | ............ 257/487 |
| 63-065641 | 3/1988 | Japan . | |
| 03148852 | 6/1991 | Japan . | |
| 04239154 | 8/1992 | Japan . | |

*Primary Examiner*—Sara W. Crane
*Assistant Examiner*—Stephen D. Meier
*Attorney, Agent, or Firm*—Cushman, Darby & Cushman

[57] ABSTRACT

A semiconductor device is provided in which a contact is very simply formed on conductive material for capacitive coupling prevention. Two silicon substrates are bonded through a silicon oxide film. And a trench extending to the silicon oxide film is formed in one of silicon substrates so as to isolate between plural circuit elements from each other, and islands for circuit element formation are compartmently formed by the trench. A silicon oxide film is formed on an outer periphery portion of the islands for circuit element formation. Furthermore, an island for capacitive coupling prevention is formed by the silicon substrate between the islands for circuit element formation and is applied thereto to be maintained in an electric potential of constant.

18 Claims, 3 Drawing Sheets

SEMICONDUCTOR DEVICE PROVIDED WITH ISOLATION REGION

BACKGROUND OF THE INVENTION

1. Field of the Invention

The present invention relates to a semiconductor device provided with a region for isolation between semiconductor elements, particularly a isolation region given by an insulator or dielectric material.

2. Description of the Related Arts

Conventionally, there is a dielectric isolation method given by a trench in a bipolar integrated circuit integrating bipolar transistors. In this method, a dielectric isolation portion is given by a capacitor structure in construction. Thus, interference between circuits often becomes an issue. Accordingly, there is offered a method in which conductive material is buried in a trench so as to fix an electric potential of constant thereby to prevent capacitive coupling and to prevent interference between circuits (for instance, Japanese Patent Publication leid open No. 3-148852).

Incidentally, for an isolation region in the trench portion flatness of an upper portion of the trench must be originally ensured. However, an electrode drawing portion becomes necessary because a contact may not be directly formed on the buried conductive material in the trench. Thus, it is difficult to ensure the flatness. In addition, it is considered to form the trench portion widely. However, it takes an hour to fully bury the trench portion with conductive material. It is undesirable that a surplus amount of conductive material accumulated on the semiconductor substrate also increased to facilitate lowering of flatness of the trench upper portion more and more and to increase etching time. Furthermore, it has been required to increase masking process for forming a contact on the buried conductive material.

SUMMARY OF THE INVENTION

An object of the present invention is, therefore, to provide a semiconductor device capable of very easily forming a contact on conductive material for capacitive coupling prevention.

The substance of the present invention is offered by that in a semiconductor device in which plural circuit elements are formed in a monocrystalline semiconductor layer provided on an insulation film, the semiconductor device comprises islands for circuit element formation compartmently formed, by a trench extending to the insulation film, on the monocrystalline semiconductor layer arranged on the insulation film; an insulation layer formed on an outer periphery portion of the islands for circuit element formation; and an island for capacitive coupling prevention formed on the monocrystalline layer between the islands for circuit element formation and applied thereto to be maintained in an electric potential of constant.

According to the present invention, monocrystalline semiconductor basic material like constructing material of the islands for circuit element formation is used as material for capacitive coupling prevention. Thus, a layer for capacitive coupling prevention may be obtained simultaneously with forming a semiconductor element on the islands for circuit element formation. Accordingly, a contact may be formed on the layer for capacitive coupling prevention together with forming an electrode of a semiconductor element and increase of process may not be caused. And a width of a trench may not be increased in vain.

BRIEF DESCRIPTION OF THE DRAWINGS

These and other objects and advantages of this invention will become more apparent and more readily appreciated from the following detailed description of the presently preferred exemplary embodiments of the invention taken in conjunction with the accompanying drawings, of which.

DETAILED DESCRIPTION OF THE EMBODIMENTS (THE FIRST EMBODIMENT)

Hereinafter, an embodiment in which the present invention is embodied will be explained according To the drawings.

Figure 1:
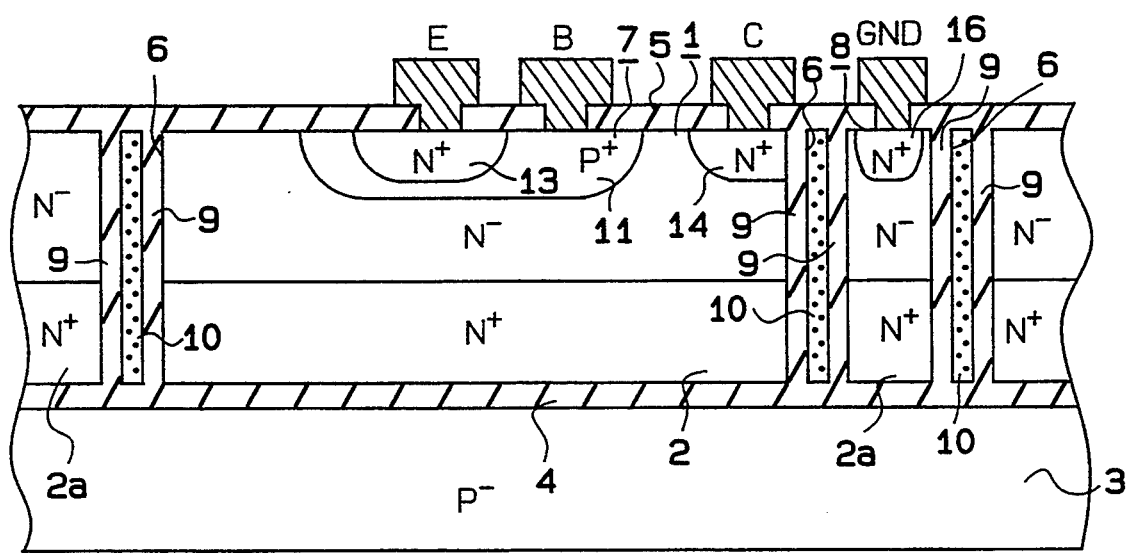
FIG. 1 is a sectional view depicting a schematic structure of a semiconductor device of the first embodiment according to the present invention.

FIG. 1 is a constructive view showing an embodiment of the present invention. And FIG. 2 to FIG. 5 show the fabricating process.

Figure 2:
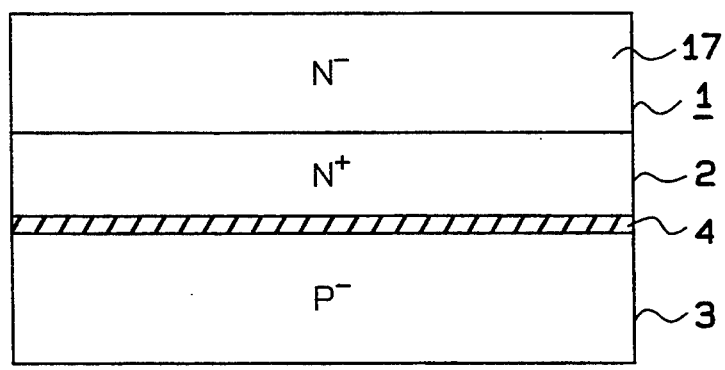
FIG. 2 through FIG. 4 are sectional views in order of process of the semiconductor device of the above-mentioned first embodiment.

Explaining the fabricating process, firstly, an N− monocrystalline silicon substrate 1 which is mirror polished is provided as shown in FIG. 2, and antimony is diffused in a surface of the substrate 1 by 3 μm with a vapor phase diffusion method to form an N+ layer 2. On the other hand, a P− monocrystalline silicon substrate 3 is mirror polished on one main face thereof and thereafter thermally oxidized to form a silicon oxide film 4 of the thickness 1 μm. Then, by using a conventional direct bonding technique of a substrate both the substrates 1, 3 are laminated in a clean atmosphere and heated at about 1,100° C. to bond to each other.

Furthermore, the bonded substrate is polished at the side of the N− silicon substrate 1 to make the thickness from the silicon oxide film 4 about 17 μm. At this timing the N+ layer 2 of about 3 μm is present on the silicon oxide film 4, and an N− layer 17 of 14 μm is formed on the silicon oxide film 4 to form so-called an SOI substrate.

Figure 3:
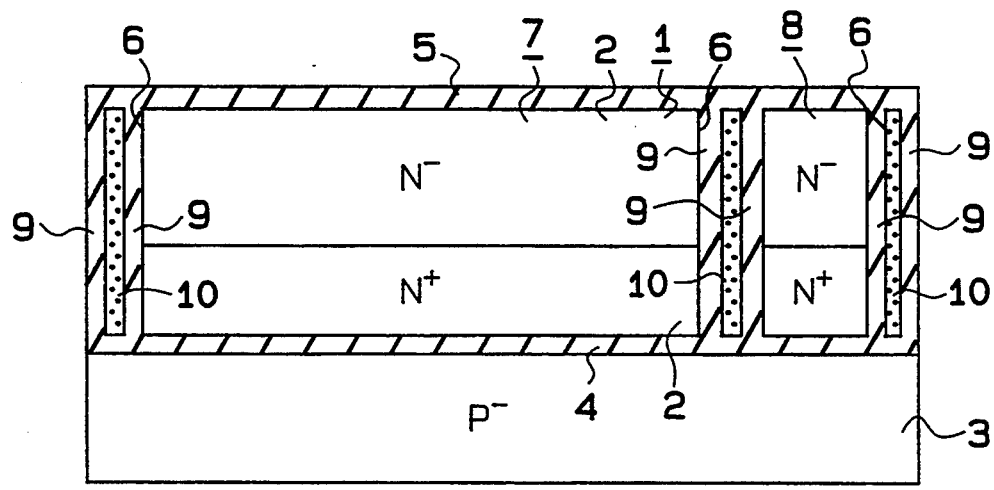

Next, as shown in FIG. 3, a field oxide film 5 having partially a thick portion, a silicon nitride film and a silicon oxide film as a mask are formed on a main face of the silicon substrate 1 in order. And in a thin region of the field oxide film 5 the field oxide film 5, the silicon nitride film and the silicon oxide film are selectively etched to form an opening, and thereafter the silicon substrate 1 is etched from the opening to form an isolation trench which extends to the silicon oxide film 4.

Figure 5:
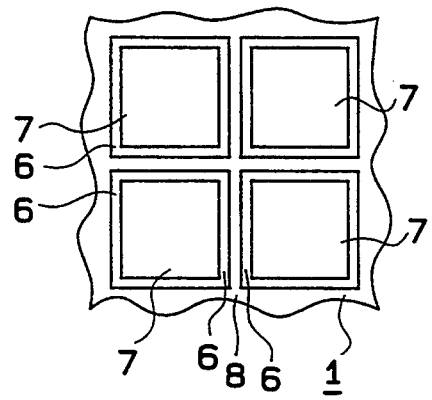
FIG. 5 is a diagrammatic plane view of the semiconductor device of the above-mentioned embodiment.

FIG. 5 shows a plane view indicating a forming pattern of a trench 6. A number of islands 7 for circuit element formation is compartmently formed by the trench 6, as shown in FIG. 5, and an island 8 for capacitive coupling prevention is formed between the islands 7 for circuit element formation. As understood from FIG. 5, it is understood that at least two trenches are formed between the two islands 7 for circuit element formation. Furthermore, the island 8 for capacitive coupling prevention is arranged in lattice pattern among a number of the islands 7 for circuit element formation.

And, after an insulation film (a silicon oxide film 9) has been formed on an internal wall face of the isolation trench in FIG. 3, polycrystalline silicon 10 is filled in the above-mentioned isolation trench. Furthermore, the polycrystalline silicon 10 accumulated on the above-mentioned nitride film while filling of the polycrystalline silicon 10 is etched back. At this instance a width of each trench is not widely set but is set into a width sufficiently for providing dielectric isolation between circuit elements. Thus, an amount of the polycrystalline silicon 10 filled in the isolation trench is not so much, and surplus polycrystalline silicon accuumulated on the upper portion when filling is also little. Subsequently, The silicon oxide film as the mask is removed by etching. And finally, after the silicon nitride film has been removed by etching, an oxide film is formed on an upper portion of the polycrystalline silicon 10 in the isolation trench to electrically isolate completely regions in the silicon substrate 1, namely the islands 7, 8 to each other by the isolation trench and the dielectric film (the silicon oxide film 9).

Figure 4:
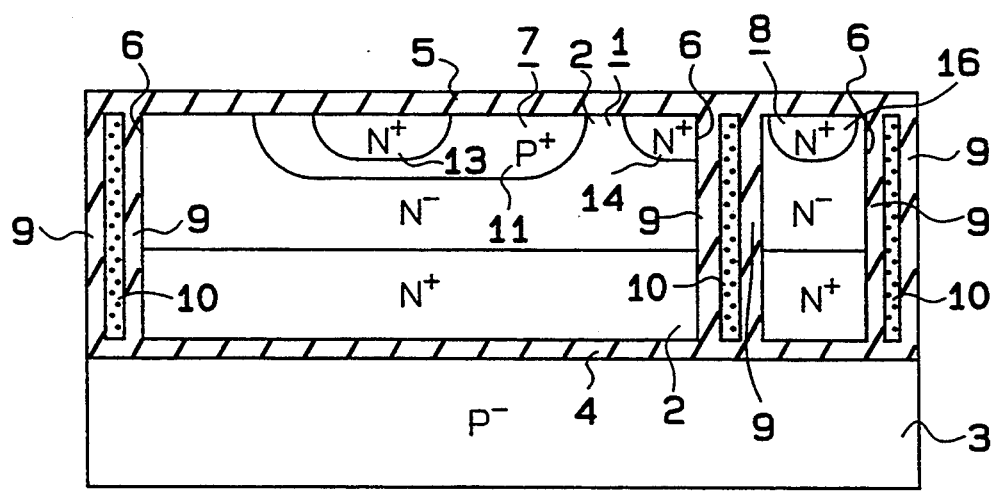

Next, as shown in FIG. 4, by conventional photolithography process, ion implantation process and diffusion process, a P+ base region 11 is formed and an N+ emitter region 13 and an N+ collector region 14 are formed.

Furthermore an N+ region 16 for contact is formed on a surface of the island 8 for capacitive coupling prevention simultaneously with forming the emitter region 13, the collector region 14 and the like. Finally, contact holes are formed on the oxide film 5 in the island 7 for circuit element formation and the island 8 for capacitive coupling prevention, and electrode wiring is formed to fabricate the bipolar integrated circuit of FIG. 1. Additionally, in the embodiment the island 8 for capacitive coupling prevention is fixed to a grounding electric potential.

Herein, the silicon oxide film 4 ( a buried dielectric film) is formed on the silicon substrate 3, the insulating portion (the silicon oxide film 9) is formed in a trench state from the substrate surface, and the element portion is isolated from the substrate 3 and in a lateral direction from each other. In this embodiment, the polycrystalline silicon 10 for protection is filled in a cavity portion formed in the trench portion. E, B and C in the figure are abbreviated reference characters of an emitter, a base and a collector respectively. A metal electrode such as aluminum or the like is arranged on the outermost face portion and is connected to a semiconductor element through a contact hole provided on an electrode forming portion of the oxide film 5 which is a protective insulation layer of the semiconductor element. And an N+ layer 2a is arranged at a lower portion of the island 8 for capacitive coupling prevention.

As described above, in the embodiment, the island 8 for capacitive coupling prevention is formed of the material of the monocrystalline silicon substrate 1, and the island 8 for capacitive coupling prevention is applied thereto to be maintained in an electric potential of constant. Thus, an electrode drawing portion for contact may be unnecessary, differently from making filled material in the trench conductive and a layer for capacitive coupling prevention, as the prior art. Namely, in the embodiment, the trench is formed between the islands for circuit element formation so as to sandwich the island 8 for capacitive coupling prevention by using the substrate itself as conductive material for the layer for capacitive coupling prevention. Thus, it is possible to form an electrode for contact also on the island 8 for capacitive coupling prevention simultaneously with electrode forming of each island 7 for circuit element formation. Accordingly, it is possible to very easily provide a contact to the conductive material for capacitive coupling prevention with ensuring flatness in the upper portion of the isolation region between circuit elements and without increase of masking process. The N+ layer 2a is arranged over the whole of the island region on the lower portion of the island 8 for capacitive coupling prevention. Therefore, even if the contact portion of the island 8 for capacitive coupling prevention or a forming location of the N+ region 16 is disposed at a chip end portion, it is possible to fix uniformly an electric potential over the whole range of the island 8 for capacitive coupling prevention, and it is available to prevention of cross talk between the circuit elements. Furthermore, it is not necessarily needed to arrange the N+ region 16 at a circuit element integrating portion in a chip. Accordingly, it is possible to narrow a space between trenches arranged between the islands 7 for circuit element formation, namely a width of the island 8 for capacitive coupling prevention. This is advantageous to high integration.

(THE SECOND EMBODIMENT)

Next, the second embodiment will be explained with points of difference from the first embodiment mainly.

Figure 6:
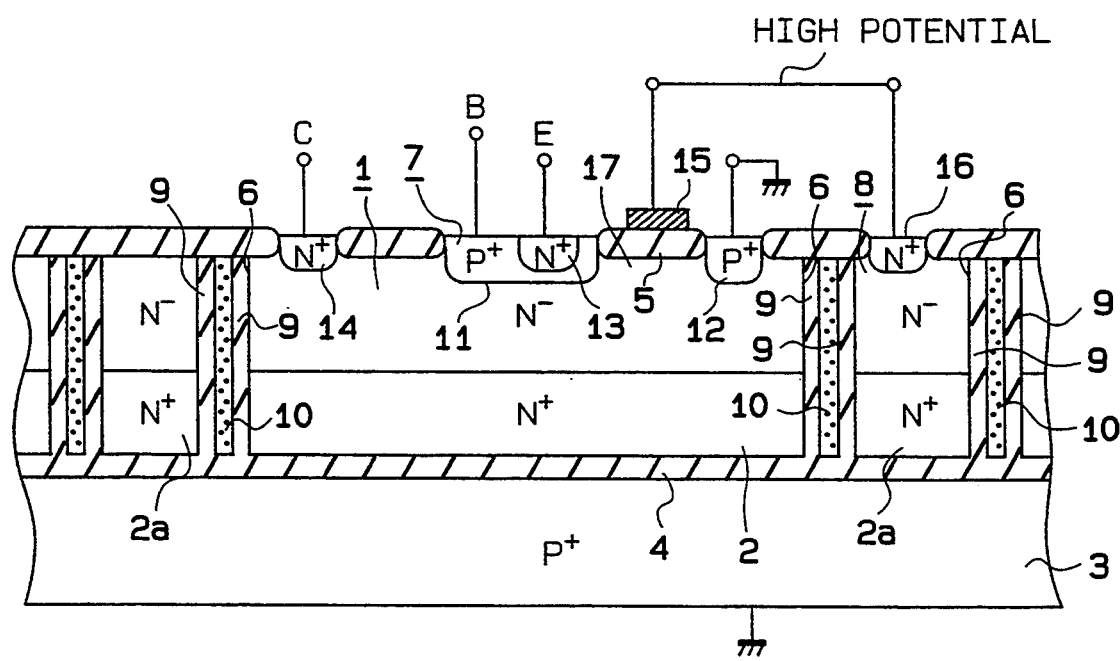
FIG. 6 is a sectional view of a semiconductor device of the second embodiment according to the present invention.

As shown in FIG. 6, in the second embodiment, a diffusion region 12 for extracting excessive carriers is formed for the purpose of quickening a switching speed of a NPN transistor by swiftly extracting excessive carriers when the NPN transistor is switched from ON to OFF. The excessive carrier extraction region 12 is fixed to a GND electric potential (a grounding electric potential). The excessive carriers are removed through the excessive carrier extraction region 12 when the NPN transistor is switched from ON to OFF, and thus The switching speed quickens.

Additionally, the NPN junction type transistor given by this structure is completely isolated from the substrate 3 by the insulation film 4 such as a silicon oxide film or the like. Thus, the substrate 3 may be a substrate of any type such as P type or N type.

As shown in FIG. 6, a polysilicon electrode 15 is arranged on the silicon oxide film 5 between the P+ base region 11 and the P+ excessive carrier extraction region 12. This polysilicon electrode 15 is utilized to restrain extension of a depletion layer by an electric potential given to the polysilicon electrode 15 so as to restrain that a withstand voltage between the N− layer 17 and the excessive carrier extraction layer 12 is about to lower when the depletion layer extends to the N− layer 17 from a PN junction between the N− layer 17 and the excessive carrier extraction layer 12 in a saturation range of the transistor. Namely, this is utilized to evade deterioration of the withstand voltage caused by a punch-through in a (100) substrate having a low surface electric charge density Qss.

Meanwhile, an N+ region 16 is formed at a surface of an island 8 for capacitive coupling prevention. And the polysilicon electrode 15 and the N− region 16 are electrically connected to each other with the N+ region 16 maintained in an electric potential of a high level (for instance, an electric potential of a power source). Accordingly, wiring which will be connected to an other region in the chip for maintaining the potysilicon electrode 15 in the electric potential of the high level may be shortened by connecting the polysilicon electrode 15 with the N+ region 16, thereby to make the chip size small. Furthermore, an N+ layer 2a is present at a lower surface of the island 8 for capacitive coupling prevention, and the N+ layer 2a is formed over the whole of the island 8 for capacitive coupling prevention. Thus, even if a contact point of the island 8 for capacitive coupling prevention, namely a location for forming the N+ region 16 is set at an end portion of the chip, a lateral resistance value of the whole of the island 8 for capacitive coupling prevention may be made small by the N+ layer 2a to fix uniformly an electric potential of constant over the whole of the island 8 for capacitive coupling prevention.

In addition, although in the second embodiment an LOCOS method is used, it may be also used in the first embodiment.

Additionally, it is preferable that an electric potential of the island for capacitive coupling prevention is set into the maximum or minimum of an electric potential of the chip such as the grounding electric potential or the electric potential of the power source maintained in constant as described in the above-mentioned embodiment.

As described above in detail, according to the present invention, it is possible to exhibit an excellent effect that a contact may be extremely formed easily on conductive material for capacitive coupling prevention.

What is claimed is:

1. A semiconductor device provided with an isolation region between circuit elements, comprising:
   a substrate having an insulation film on a surface thereof;
   a monocrystalline semiconductor layer disposed on said substrate with said insulation film interposed therebetween, said monocrystalline semiconductor layer being partitioned into a plurality of islands for circuit element formation by trenches extending to said insulation film from a surface of said monocrystalline semiconductor layer, and said trenches being provided around said islands for circuit element formation, respectively;
   insulation layers each for burying a corresponding trench therein;
   a region, for capacitive coupling prevention, formed of a monocrystalline semiconductor substance which forms said monocrystalline semiconductor layer, said region for capacitive coupling prevention being disposed between said plurality of islands for circuit element formation and independent from said plurality of islands for circuit element formation by said trenches; and
   means for applying a constant electric potential to said region for capacitive coupling prevention.

2. A semiconductor device according to claim 1, wherein each of said insulation layers is composed of an oxide film and polycrystalline silicon filled in the interior of said oxide film.

3. A semiconductor device provided with an isolation region between circuit elements, comprising:
   a substrate having an insulation film on a surface thereof;
   a monocrystalline semiconductor layer disposed on said substrate with said insulation film interposed therebetween, said monocrystalline semiconductor layer being divided into a plurality of islands for circuit element formation by trenches each extending to said insulation film from a surface of said monocrystalline semiconductor layer, and each of said trenches being provided around each of said plurality of islands for circuit element formation;
   insulation layers burying said trenches, respectively;
   a region, for capacitive coupling prevention, formed of a one conductivity type monocrystalline semiconductor substance which forms said monocrystalline semiconductor layer, said region for capacitive coupling prevention being disposed between said plurality of islands for circuit element formation and independent from said plurality of islands for circuit element formation by said trenches;
   means for applying a constant electric potential to said region for capacitive coupling prevention; and
   a semiconductor layer of said one conductivity type formed at a lower surface of said monocrystalline semiconductor layer constructing said region for capacitive coupling prevention and having a concentration higher than said monocrystalline semiconductor layer forming said region for capacitive coupling prevention.

4. A semiconductor device as claimed in claim 3, wherein at least one of said islands for circuit element formation has and N+ emitter region, a P+ (base region), an N− collector region, and a P+ diffusion region for extracting excessive carriers formed in said N− collector region.

5. A semiconductor device as claimed in claim 4, wherein an oxide film is formed on a surface of said monocrystalline semiconductor layer forming said one of said islands for circuit element formation, and a plate electrode is disposed on said oxide film between said P+ diffusion base region for extracting excessive carriers.

6. A semiconductor device as claimed in claim 5, wherein a contact region of one conductivity type with high concentration is formed at a surface of said region for capacitive coupling preventing, and said contact region and said plate electrode are electrically connected, and electric potential of said region for capacitive coupling prevention being maintained in a high level.

7. A semiconductor device according to claim 3, wherein each of said insulation layers is composed of an oxide film and polycrystalline silicon filled in the interior of said oxide film.

8. A semiconductor device comprising:
   an insulation film;
   a monocrystalline semiconductor substrate provided on said insulation film;
   said monocrystalline semiconductor substrate having at least two of first island regions for circuit element formation and a second island region disposed between said first island regions and surrounding each of said first island regions with trenches disposed therebetween, said trenches surrounding said first island regions, respectively;
   insulation layers filled in said respective trenches to surround said first island regions for circuit element formation, respectively;
   an applying means for applying a constant electric potential to said second island a region, whereby said second island region functions as a region for capacitive coupling prevention formed of monocrystalline semiconductor material; and a high impurity concentration region entirely formed in said second island region.

9. A semiconductor device as claimed in claim 8, wherein at least one of said first island regions has an N+ emitter region, a P+ base region and an N− collector region, a P+ diffusion region for extracting excessive carriers being formed in said N− collector region.

10. A semiconductor device as claimed in claim 9, further comprising an oxide film formed on a surface of said semiconductor substrate forming said one of said first island regions, and a plate electrode provided on said oxide film between said P+ base region and said P+ diffusion region for extracting excessive carriers.

11. A semiconductor device as claimed in claim 10, further comprising a contact region of one conductivity type with high concentration formed at a surface of said second island region, and wherein said contact region and said plate electrode are electrically connected and an electric potential of said second island region is maintained in a high level.

12. A semiconductor device as claimed in claim 8, wherein said second island region has a carrier concentration distribution equal to carrier concentration distribution in said first island region.

13. A semiconductor device as claimed in claim 12, wherein said high impurity concentration region entirely formed in said second island region is located at a bottom side of said monocrystalline semiconductor substrate of said second island region and said first island region has a high impurity concentration region located at a bottom side thereof, whereby both said carrier concentration distribution in said second island region and said carrier concentration distribution in said first island region become higher in carrier density at said respective bottom side.

14. A semiconductor device according to claim 8, wherein each of said insulation layers is composed of an oxide film and polycrystalline silicon filled in the interior of said oxide film.

15. A semiconductor device as claimed in claim 8, wherein said high impurity concentration region entirely formed in said second island region is located at a bottom side of said monocrystalline semiconductor substrate of said second island region.

16. A semiconductor device as claimed in claim 15, wherein said first island region has a high impurity concentration region located at a bottom side thereof.

17. A semiconductor device in which plural circuit elements are formed on a silicon substrate provided on an insulation film, the semiconductor device comprising:

first and second islands for circuit element formation formed of a monocrystalline material of said silicon substrate arranged on said insulation film;

first and second insulation portions surrounding said first and second islands for circuit element formation, respectively; and a region for capacitive coupling prevention disposed between said first and second insulation portions and applied thereto to be maintained in a constant electric potential, said region for capacitive coupling prevention being formed of the monocrystalline material of said silicon substrate.

18. A semiconductor device as claimed in claim 17, wherein each of said first and second insulation portions is composed of a silicon oxide film and polycrystalline silicon filled in the interior of said silicon oxide film.

* * * * *